United States Patent
Hsu

(10) Patent No.: US 9,368,762 B2
(45) Date of Patent: Jun. 14, 2016

(54) ACTIVE ORGANIC ELECTROLUMINESCENCE DEVICE BACK PANEL AND MANUFACTURING METHOD THEREOF

(71) Applicant: Shenzhen China Star Optoelectronics Technology Co., Ltd., Shenzhen, Guangdong (CN)

(72) Inventor: Yuanjun Hsu, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 0 days.

(21) Appl. No.: 14/938,810

(22) Filed: Nov. 11, 2015

(65) Prior Publication Data

US 2016/0064701 A1    Mar. 3, 2016

Related U.S. Application Data

(62) Division of application No. 14/124,716, filed on Dec. 8, 2013.

(51) Int. Cl.
*H01L 29/08* (2006.01)
*H01L 51/56* (2006.01)
*H01L 27/12* (2006.01)
*H01L 27/32* (2006.01)

(52) U.S. Cl.
CPC ............ *H01L 51/56* (2013.01); *H01L 27/1237* (2013.01); *H01L 27/3246* (2013.01); *H01L 27/3262* (2013.01)

(58) Field of Classification Search
CPC .................................................. H01L 27/3262
USPC ............................... 257/40, E31.124; 438/23
See application file for complete search history.

(56) References Cited

U.S. PATENT DOCUMENTS

2009/0159894 A1*  6/2009  Yasumatsu .......... H01L 21/3003
                                                                257/72
2014/0117320 A1*  5/2014  Jung ................... H01L 27/3276
                                                                257/40

* cited by examiner

*Primary Examiner* — Matthew Gordon
(74) *Attorney, Agent, or Firm* — Andrew C. Cheng

(57) ABSTRACT

An active organic electroluminescence device back panel and a manufacturing method thereof are disclosed. The device back panel includes: a substrate, a plurality of active TFT pixel arrays formed on the substrate, and organic planarization layers, organic electroluminescence electrodes, pixel definition layers, and support bodies formed on the active TFT pixel arrays. Each of the active TFT pixel arrays includes a driving TFT and a switch TFT. The driving TFT has a gate insulation layer that has a thickness greater than a thickness of a gate insulation layer of the switch TFT. Through thickening the gate insulation layer of the driving TFT, the gate capacitance of the driving TFT can be reduced and the sub-threshold swing of the driving TFT is increased to realize well definition of grey levels.

8 Claims, 3 Drawing Sheets

ACTIVE ORGANIC ELECTROLUMINESCENCE DEVICE BACK PANEL AND MANUFACTURING METHOD THEREOF

CROSS REFERENCE TO RELATED APPLICATIONS

This is a divisional application of co-pending U.S. patent application Ser. No. 14/124,716, filed on Dec. 8, 2013.

BACKGROUND OF THE INVENTION

1. Field of the Invention

The present invention relates to the field of flat displaying, and in particular to an active organic electroluminescence device back panel and a manufacturing method thereof.

2. The Related Arts

A flat display device has various advantages, such as thin device body, low power consumption, and being free of radiation, and is thus of wide applications. The flat display devices that are currently available include liquid crystal displays (LCDs) and organic electroluminescence devices (OELDs), which are also referred to as organic light emitting diodes (OLEDs).

The known liquid crystal displays are generally backlighting liquid crystal displays, which include an enclosure, a liquid crystal display panel arranged in the enclosure, and a backlight module mounted inside the enclosure. The principle of operation of the liquid crystal display panel is that liquid crystal molecules are interposed between two parallel glass substrates and a driving voltage is applied to the glass substrates to control the rotation of the liquid crystal molecules so as to refract out the light from the backlight module to form an image.

The organic electroluminescence devices, which show the characteristics of self-illumination, high brightness, wide view angle, high contrast, flexibility, and low energy consumption, attract wide attention for serving as the next-generation display measures and gradually substitute the conventional liquid crystal displays for wide applications in various fields including mobile phone screens, computer monitors, and full-color television. The organic electroluminescence devices are different from the conventional liquid crystal displays in that they need no backlight and they use extremely thin coating layers of organic materials directly formed on the glass substrates so that when electrical currents flow therethrough, the organic material coating layers emit light.

The currently available organic electroluminescence devices are classified according to the driving methods used and include passive-matrix organic light emitting diodes (PMOLEDs) and active-matrix organic light emitting diodes (AMOLEDs). As shown in FIG. 1, the AMOLEDs generally comprise a substrate 502, a thin-film transistor (TFT) 504 formed on the substrate 502, and an organic light-emitting diode 506 formed on the TFT 504. The TFT 504 drives the organic light-emitting diode 506 to give off light in order to display a corresponding image.

Thin-film transistors include driving TFTs, switch TFTs, and other circuit TFTs. In the manufacture of an organic electroluminescence device, gate insulation (GI) layers of the driving TFTs, the switch TFTs, and other circuit TFTs are formed at the same time, having the same thickness, and this makes the driving TFTs, the switch TFTs, and the other circuit TFTs possess identical gate capacitance (Ci). In respect of sub-threshold swing (S.S.) of a thin-film transistor, it is known from the formula: $S.S.=kT/q\ ln10(1+Cd/Ci)$ that sub-threshold swing of a thin-film transistor is determined by the gate capacitance, which is in turn determined by the thickness of the gate insulation layer ($C=\epsilon A/d$) It is thus obvious that when the gate insulation layers of the driving TFTs, the switch TFTs, and the other circuit TFTs are of identical thicknesses, the sub-threshold swings of the driving TFTs, the switch TFTs, and the other circuit TFTs would be of the same magnitude.

The physical meaning of the sub-threshold swing of a thin-film transistor is the slope of the curve of gate voltage and drain current in a sub-threshold zone. Generally, curves that have very high slopes in the sub-threshold zone are disadvantageous for input control of a control voltage that reflects grey level variation. Curves having relatively low slopes in the sub-threshold zone are advantageous for control of the control voltage that reflects grey level variation. Thus, when the sub-threshold swing of a thin-film transistor is relatively small, it would be difficult to define the grey levels of an organic electroluminescence device. On the other hand, if the thickness of the gate insulation layer is increased to increase the sub-threshold swing of the driving TFTs for the purposes of easy define of the grey level, then the sub-threshold swings of the switch TFTs and other circuit TFTs would be also increased, leading to an increase of operating voltages thereby lowering the operation speeds of the circuits.

Thus, there is a conflict existing between the sub-threshold swing of the driving TFT and the sub-threshold swings of the switch TFTs and other circuit TFTs. It is necessary to have a solution that overcomes the conflict in order to further improve the quality of the organic electroluminescence devices.

SUMMARY OF THE INVENTION

An object of the present invention is to provide an active organic electroluminescence device back panel, which has a simple structure, allows easy definition of grey levels, has a low operating voltage, and provides a high circuit operation speed.

Another object of the present invention is to provide a manufacturing method of an active organic electroluminescence device back panel, which has a simply manufacturing process and enables an effective increase of a sub-threshold swing of a driving thin-film transistor, while keeping a sub-threshold swing of a switch thin-film transistor low, so as to allow easy definition of grey levels without affecting an operating voltage and a circuit operation speed thereby improving the quality of an organic electroluminescence device.

To achieve the above objects, the present invention provides an active organic electroluminescence device back panel, which comprises: a substrate, a plurality of active TFT pixel arrays formed on the substrate, and organic planarization layers, organic electroluminescence electrodes, pixel definition layers, and support bodies formed on the active TFT pixel arrays. Each of the active TFT pixel arrays comprises a driving TFT and a switch TFT. The driving TFT having a gate insulation layer that has a thickness greater than a thickness of a gate insulation layer of the switch TFT.

The driving TFT comprises a crystalline semiconductor layer formed on the substrate, a first gate insulation layer formed on the crystalline semiconductor layer, a gate insulation structure formed on the first gate insulation layer, a gate terminal formed on the gate insulation structure, a protective layer formed on the gate terminal, and a source/drain terminal formed on the protective layer. The first gate insulation layer and the gate insulation structure collectively form the gate insulation layer of the driving TFT. The gate insulation structure functions to reduce gate capacitance of the driving TFT so as to increase sub-threshold swing of the driving TFT to thereby help realizing definition of grey levels.

The thickness of the gate insulation layer of the switch TFT is less than or equal to the thickness of the first gate insulation layer of the driving TFT.

The organic planarization layer is formed on the source/drain terminal.

The protective layer comprises one of a silicon oxide layer and a silicon nitride layer or a combination thereof and the organic electroluminescence electrode is made of a material comprising at least one of indium tin oxide and silver or a combination thereof.

The first gate insulation layer comprises a single-layer or multi-layer structure, which comprises one of a silicon oxide layer and a silicon nitride layer or a combination thereof and the gate insulation structure comprises a single-layer or multi-layer structure, which comprises one of a silicon oxide layer and a silicon nitride layer or a combination thereof.

Further comprised is a buffering layer, and the buffering layer is arranged between the substrate and the active TFT pixel arrays.

The present invention also provides an active organic electroluminescence device back panel, which comprises: a substrate, a plurality of active TFT pixel arrays formed on the substrate, and organic planarization layers, organic electroluminescence electrodes, pixel definition layers, and support bodies formed on the active TFT pixel arrays, each of the active TFT pixel arrays comprising a driving TFT and a switch TFT, the driving TFT having a gate insulation layer that has a thickness greater than a thickness of a gate insulation layer of the switch TFT;

wherein the driving TFT comprises a crystalline semiconductor layer formed on the substrate, a first gate insulation layer formed on the crystalline semiconductor layer, a gate insulation structure formed on the first gate insulation layer, a gate terminal formed on the gate insulation structure, a protective layer formed on the gate terminal, and a source/drain terminal formed on the protective layer, the first gate insulation layer and the gate insulation structure collectively forming the gate insulation layer of the driving TFT, the gate insulation structure functioning to reduce gate capacitance of the driving TFT so as to increase sub-threshold swing of the driving TFT to thereby help realizing definition of grey levels; and wherein the thickness of the gate insulation layer of the switch TFT is less than or equal to the thickness of the first gate insulation layer of the driving TFT.

The organic planarization layer is formed on the source/drain terminal.

The protective layer comprises one of a silicon oxide layer and a silicon nitride layer or a combination thereof and the organic electroluminescence electrode is made of a material comprising at least one of indium tin oxide and silver or a combination thereof.

The first gate insulation layer comprises a single-layer or multi-layer structure, which comprises one of a silicon oxide layer and a silicon nitride layer or a combination thereof and the gate insulation structure comprises a single-layer or multi-layer structure, which comprises one of a silicon oxide layer and a silicon nitride layer or a combination thereof.

Further comprised is a buffering layer, and the buffering layer is arranged between the substrate and the active TFT pixel arrays.

The present invention further provides a manufacturing method of an active organic electroluminescence device back panel, which comprises the following steps:

(1) providing a substrate;
(2) forming a buffering layer on the substrate;
(3) forming a crystalline semiconductor layer on the buffering layer;
(4) depositing, in sequence, a lower gate insulation layer and an upper gate insulation layer on the crystalline semiconductor layer;
(5) patternizing the upper gate insulation layer to form a gate insulation structure of a driving TFT, while the lower gate insulation layer forming a first gate insulation layer of the driving TFT and a gate insulation layer of a switch TFT, wherein the first gate insulation layer and the gate insulation structure collectively form a gate insulation layer of the driving TFT;
(6) forming a gate terminal, a protective layer, and a source/drain terminal of the driving TFT on the gate insulation layer of the driving TFT and at the same time, forming a gate terminal, a protective layer, and a source/drain terminal of the switch TFT on the gate insulation layer of the switch TFT;
(7) forming an organic planarization layer on the source/drain terminal of the driving TFT and the source/drain terminal of the switch TFT; and
(8) forming an organic electroluminescence electrode on the organic planarization layer, so that the organic electroluminescence electrode is connected to the source/drain terminal of the driving TFT.

Further included is step (9): forming a pixel definition layer on the organic planarization layer and forming a support body on the pixel definition layer.

The first gate insulation layer comprises a single-layer or multi-layer structure, which comprises one of a silicon oxide layer and a silicon nitride layer or a combination thereof; the gate insulation structure comprises a single-layer or multi-layer structure, which comprises one of a silicon oxide layer and a silicon nitride layer or a combination thereof; the protective layer comprises one of a silicon oxide layer and a silicon nitride layer or a combination thereof; and the organic electroluminescence electrode is made of a material that comprises at least one of indium tin oxide and silver or a combination thereof.

The efficacy of the present invention is that the present invention provides an active organic electroluminescence device back panel and a manufacturing method thereof, wherein through thickening the gate insulation layer of the driving TFT, the gate capacitance of the driving TFT can be reduced and the sub-threshold swing of the driving TFT is increased to realize well definition of grey levels. Further, the thickness of the gate insulation layer of the switch TFT can be kept unchanged so that the sub-threshold swing of the switch TFT maintains relatively small so as to lower down the operating voltage and increase the circuit operation speed to thereby effectively improve the quality of the organic electroluminescence device.

For better understanding of the features and technical contents of the present invention, reference will be made to the following detailed description of the present invention and the attached drawings. However, the drawings are provided for the purposes of reference and illustration and are not intended to impose undue limitations to the present invention.

BRIEF DESCRIPTION OF THE DRAWINGS

The technical solution, as well as beneficial advantages, of the present invention will be apparent from the following detailed description of an embodiment of the present invention, with reference to the attached drawings. In the drawings.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 1:
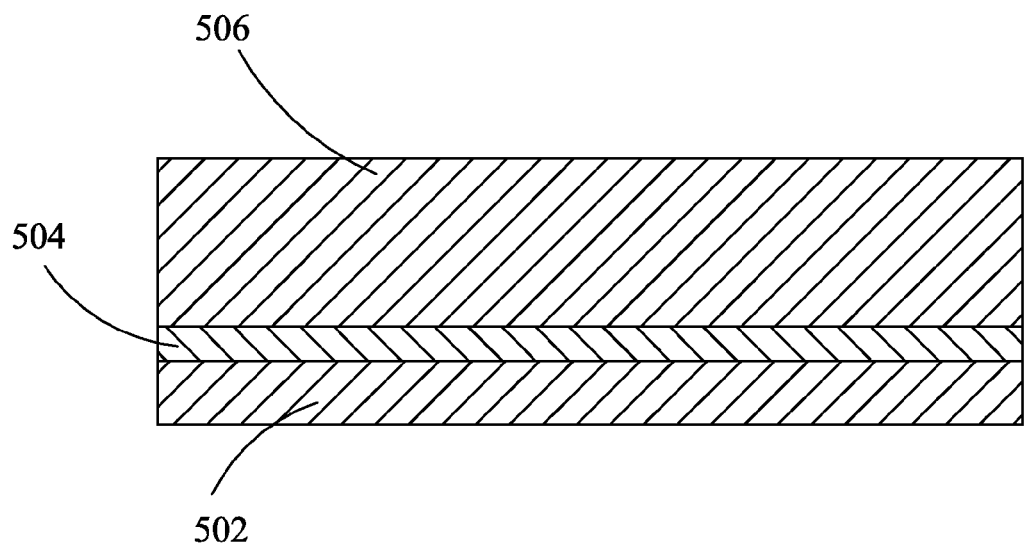
FIG. 1 is a schematic view showing a general structure of a conventional active-matrix organic light emitting diode.
Figure 2:
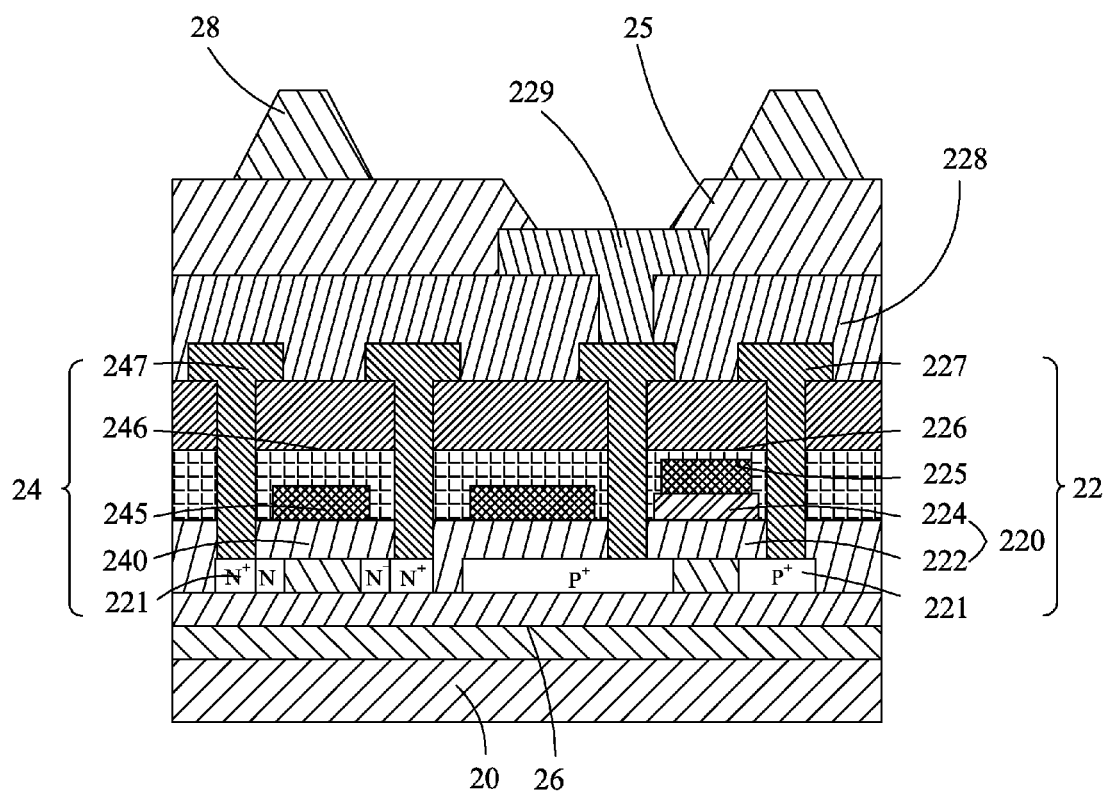
FIG. 2 is a schematic view showing an inside structure of an active organic electroluminescence device back panel according to the present invention.

Referring to FIG. 2, the present invention provides an active organic electroluminescence device back panel, which comprises: a substrate 20, a plurality of active thin-film transistor (TFT) pixel arrays formed on the substrate 20, and organic planarization layers 228, organic electroluminescence electrodes 229, pixel definition layers 25, and support bodies 28 formed on the active TFT pixel arrays. Each of the active TFT pixel arrays comprises a driving TFT 22 and a switch TFT 24. The driving TFT 22 has a gate insulation layer 220 that has a thickness greater than a thickness of a gate insulation layer 240 of the switch TFT 24, whereby the driving TFT 22 has gate capacitance that is less than gate capacitance of the switch TFT 24 and thus, the driving TFT 22 has sub-threshold swing that is greater than sub-threshold swing of the switch TFT 24. Since the sub-threshold swing of the driving TFT 22 is relatively great, grey levels can be well defined. Further, since the sub-threshold swing of the switch TFT 24 is relatively small, the operating voltage can be reduced and the circuit operation speed can be enhanced.

Specifically, referring to FIG. 2, the driving TFT 22 comprises a crystalline semiconductor layer 221 formed on the substrate 20, a first gate insulation layer 222 formed on the crystalline semiconductor layer 221, a gate insulation structure 224 formed on the first gate insulation layer 222, a gate terminal 225 formed on the gate insulation structure 224, a protective layer 226 formed on the gate terminal 225, and a source/drain terminal 227 formed on the protective layer 226. The first gate insulation layer 222 and the gate insulation structure 224 collectively form the gate insulation layer 220 of the driving TFT 22. The gate insulation structure 224 functions to reduce the gate capacitance of the driving TFT 22 so as to increase the sub-threshold swing of the driving TFT 22 to thereby help realizing definition of grey levels.

In a manufacturing process of the organic electroluminescence device, the gate insulation layer 240 of the switch TFT 24 and the first gate insulation layer 222 of the driving TFT 22 are formed simultaneously so that the thickness of the gate insulation layer 240 of the switch TFT 24 is less than or equal to a thickness of the first gate insulation layer 222 of the driving TFT 22. Preferably, the gate insulation structure 224 has a thickness that is greater than the thickness of the first gate insulation layer 222, so that while the sub-threshold swing of the driving TFT 22 is made sufficiently large, the sub-threshold swing of the switch TFT 24 is still small enough.

The first gate insulation layer 222 can be of a single-layer or multi-layer structure, which comprises one of a silicon oxide layer and a silicon nitride layer or a combination thereof. The gate insulation structure 224 can be of a single-layer or multi-layer structure, which comprises one of a silicon oxide layer and a silicon nitride layer or a combination thereof.

The protective layer 226 comprises one of a silicon oxide layer and a silicon nitride layer or a combination thereof. The organic electroluminescence electrode 229 is made of a material that includes at least one of indium tin oxide and silver or a combination thereof.

Further, the organic electroluminescence device according to the present invention further comprises a buffering layer 26. The buffering layer 26 is arranged between the substrate 20 and the active TFT pixel arrays to prevent impurities from spreading to the active TFT pixel arrays.

Figure 3:
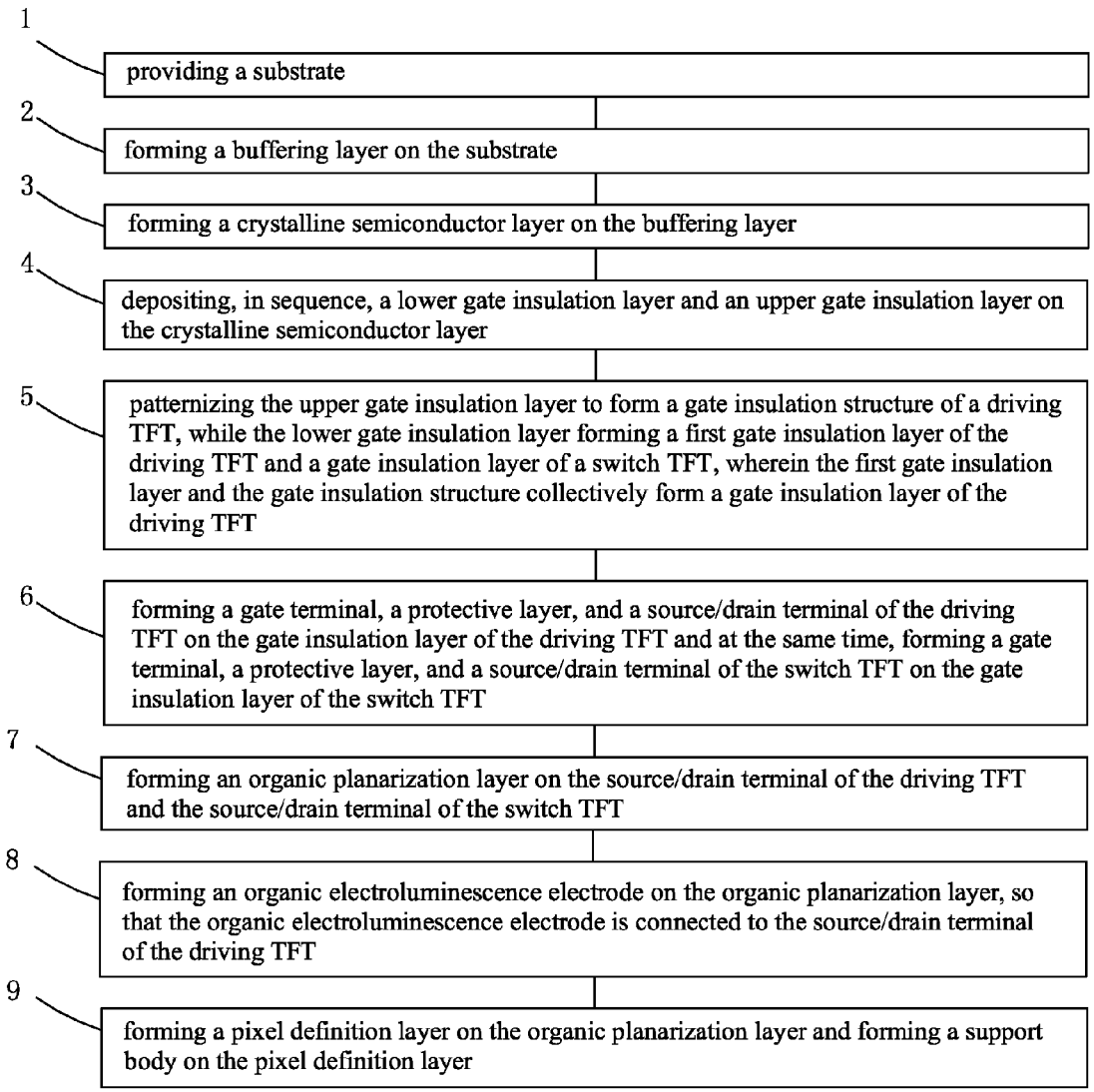
FIG. 3 is a flow chart illustrating a manufacturing method of an active organic electroluminescence device back panel according to the present invention.

Referring to FIG. 3, with additional reference to FIG. 2, the present invention further provides a manufacturing method of an active organic electroluminescence device back panel, which comprises the following steps:

Step 1: provides a substrate 20.

The substrate 20 is a transparent substrate, and preferably, in the instant embodiment, the substrate 20 is a glass substrate.

Step 2: forming a buffering layer 26 on the substrate 20.

The buffering layer 26 comprises one of a silicon oxide layer and a silicon nitride layer or a combination thereof to prevent impurities from spreading to active TFT pixel arrays.

Step 3: forming a crystalline semiconductor layer 221 on the buffering layer 26.

Specifically, an amorphous silicon layer is first formed on the buffering layer 26 and then a laser annealing operation is applied to convert the amorphous silicon layer into a polysilicon layer, followed by patternization of the polysilicon layer. Finally, a doping process is executed on the polysilicon layer to form the crystalline semiconductor layer 221.

Step 4: depositing, in sequence, a lower gate insulation layer and an upper gate insulation layer on the crystalline semiconductor layer 221.

The lower gate insulation layer and the upper gate insulation layer both can be of a single-layer or multi-layer structure, which comprises one of a silicon oxide layer and a silicon nitride layer or a combination thereof.

Step 5: patternizing the upper gate insulation layer to form a gate insulation structure 224 of a driving TFT 22, while the lower gate insulation layer forming a first gate insulation layer 222 of the driving TFT 22 and a gate insulation layer 240 of a switch TFT 24, wherein the first gate insulation layer 222 and the gate insulation structure 224 collectively form a gate insulation layer 220 of the driving TFT 22.

Specifically, the gate insulation structure 224 is formed at a predetermined location under a gate terminal 225 of the driving TFT 22. The gate insulation structure 224 is a single-layer or multi-layer structure, which comprises one of a silicon oxide layer and a silicon nitride layer or a combination thereof.

The specific operation can be as follows. A layer of a photo-sensitive material is coated on the upper gate insulation layer and the photo-sensitive material is the so called photoresist. Then, light is irradiated, through a photo mask, onto the photoresist to cause exposure of the photoresist. The photo mask carries a pattern of the gate insulation structure 224, so that the light is allowed to travel through the photo mask to irradiate onto the photoresist to realize selective exposure of the photoresist through which the pattern of the photo mask is completely transferred to the photoresist. Then, a suitable developer is applied to remove fractions of the photoresist to have the photoresist showing a desired pattern.

Since the gate insulation layer 220 of the driving TFT 22 is formed collectively of the first gate insulation layer 222 and the gate insulation structure 224, the thickness is greater than the gate insulation layer 240 of the switch TFT 24, whereby the gate capacitance of the driving TFT 22 is less than the gate capacitance of the switch TFT 24 and thus, the sub-threshold swing of the driving TFT 22 is greater than the sub-threshold swing of the switch TFT 24. Since the sub-threshold swing of the driving TFT 22 is relatively large, the grey levels can be well defined. Further, since the sub-threshold swing of the switch TFT 24 is relatively small, the operating voltage can be reduced and the circuit operation speed can be enhanced.

Step 6: forming a gate terminal 225, a protective layer 226, and a source/drain terminal 227 of the driving TFT 22 on the gate insulation layer 220 of the driving TFT 22 and at the same time, forming a gate terminal 245, a protective layer 246, and a source/drain terminal 247 of the switch TFT 24 on the gate insulation layer 240 of the switch TFT 24.

The protective layer 226 comprises one of a silicon oxide layer and a silicon nitride layer or a combination thereof.

Step 7: forming an organic planarization layer 228 on the source/drain terminal 227 of the driving TFT 22 and the source/drain terminal 247 of the switch TFT 24.

The organic planarization layer 228 functions for planarization of the entirety of the active TFT pixel array to facilitate performance of the subsequent operations.

Step 8: forming an organic electroluminescence electrode 229 on the organic planarization layer 228, so that the organic electroluminescence electrode 229 is connected to the source/drain terminal 227 of the driving TFT 22.

The organic electroluminescence electrode 229 is made of a material including at least one of indium tin oxide and silver or a combination thereof.

Step 9: forming a pixel definition layer 25 on the organic planarization layer 228 and forming a support body 28 on the pixel definition layer 25.

The support body 28 functions to support an enclosure lid (not shown), which can be formed through a masking process.

In summary, the present invention provides an active organic electroluminescence device back panel and a manufacturing method thereof, wherein through thickening the gate insulation layer of the driving TFT, the gate capacitance of the driving TFT can be reduced and the sub-threshold swing of the driving TFT is increased to realize well definition of grey levels. Further, the thickness of the gate insulation layer of the switch TFT can be kept unchanged so that the sub-threshold swing of the switch TFT maintains relatively small so as to lower down the operating voltage and increase the circuit operation speed to thereby effectively improve the quality of the organic electroluminescence device.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A manufacturing method of an active organic electroluminescence device back panel, comprising the following steps:
   (1) providing a substrate;
   (2) forming a buffering layer on the substrate;
   (3) forming a crystalline semiconductor layer on the buffering layer;
   (4) depositing, in sequence, a lower gate insulation layer and an upper gate insulation layer on the crystalline semiconductor layer;
   (5) patternizing the upper gate insulation layer to form a gate insulation structure of a driving thin-film transistor (TFT), while the lower gate insulation layer forming a first gate insulation layer of the driving TFT and a gate insulation layer of a switch TFT, wherein the first gate insulation layer and the gate insulation structure collectively form a gate insulation layer of the driving TFT such that the gate insulation layer of the driving TFT is thicker than the gate insulation layer of the switch TFT;
   (6) forming a gate terminal, a protective layer, and a source/drain terminal of the driving TFT on the gate insulation layer of the driving TFT and forming a gate terminal, a protective layer, and a source/drain terminal of the switch TFT on the gate insulation layer of the switch TFT, wherein the respective gate terminals of the driving TFT and the switch TFT are formed at the same time; wherein the respective source/drain terminals of the driving TFT and switch TFT are formed at the same time; wherein the gate terminals of the driving TFT and the switch TFT are both formed after the deposition of the lower and upper gate insulation layer; and wherein the gate terminal of the switch TFT is located outside the upper gate insulation layer and the lower gate insulation layer;
   (7) forming an organic planarization layer on the source/drain terminal of the driving TFT and the source/drain terminal of the switch TFT; and
   (8) forming an organic electroluminescence electrode on the organic planarization layer, so that the organic electroluminescence electrode is connected to the source/drain terminal of the driving TFT.

2. The manufacturing method as claimed in claim 1 further comprising step (9): forming a pixel definition layer on the organic planarization layer and forming a support body on the pixel definition layer.

3. The manufacturing method as claimed in claim 1, wherein the first gate insulation layer comprises a single-layer or multi-layer structure, which comprises one of a silicon oxide layer and a silicon nitride layer or a combination thereof.

4. The manufacturing method as claimed in claim 1, wherein the gate insulation structure comprises a single-layer or multi-layer structure, which comprises one of a silicon oxide layer and a silicon nitride layer or a combination thereof.

5. The manufacturing method as claimed in claim 1, wherein the protective layer comprises one of a silicon oxide layer and a silicon nitride layer or a combination thereof.

6. The manufacturing method as claimed in claim 1, wherein the organic electroluminescence electrode is made of a material that comprises at least one of indium tin oxide and silver or a combination thereof.

7. The manufacturing method as claimed in claim 1, wherein the gate insulation layer of the switch TFT has a thickness that is less than or equal to a thickness of the first gate insulation layer of the driving TFT.

8. The manufacturing method as claimed in claim 1, wherein the gate insulation structure of the driving TFT has a thickness that is greater than or equal to a thickness of the first gate insulation layer of the driving TFT.

* * * * *